United States Patent
Takeuchi et al.

(10) Patent No.: US 10,903,309 B2
(45) Date of Patent: Jan. 26, 2021

(54) CAPACITOR

(71) Applicant: Murata Manufacturing Co., Ltd., Nagaokakyo (JP)

(72) Inventors: Masaki Takeuchi, Nagaokakyo (JP); Tomoyuki Ashimine, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 16/709,011

(22) Filed: Dec. 10, 2019

(65) Prior Publication Data

US 2020/0119137 A1 Apr. 16, 2020

Related U.S. Application Data

(63) Continuation of application No. PCT/JP2018/032218, filed on Aug. 30, 2018.

(30) Foreign Application Priority Data

Sep. 19, 2017 (JP) .................. 2017-178826

(51) Int. Cl.
*H01L 49/02* (2006.01)
*H01L 23/00* (2006.01)

(52) U.S. Cl.
CPC .............. *H01L 28/90* (2013.01); *H01L 24/05* (2013.01); *H01L 24/45* (2013.01); *H01L 2924/1205* (2013.01); *H01L 2924/351* (2013.01)

(58) Field of Classification Search
CPC combination set(s) only.
See application file for complete search history.

(56) References Cited

U.S. PATENT DOCUMENTS 6,638,808 B1 * 10/2003 Ochi .................. H01L 23/5222
257/E23.144
6,759,692 B1 * 7/2004 Ochi .................. H01L 23/5222
257/107
(Continued)

FOREIGN PATENT DOCUMENTS

JP 2010519747 A 6/2010
JP 2012227240 A 11/2012
(Continued)

OTHER PUBLICATIONS

International Search Report issued for PCT/JP2018/032218, dated Nov. 20, 2018.
(Continued)

*Primary Examiner* — Mamadou L Diallo
(74) *Attorney, Agent, or Firm* — Arent Fox LLP

(57) ABSTRACT

A capacitor that includes a substrate having a first main surface and a second main surface that are opposite to each other, and a plurality of trench portions on the first main surface; a dielectric film adjacent the first main surface of the substrate and extending into interiors of the plurality of trench portions; a conductor film on the dielectric film and extending into the interiors of the plurality of trench portions; and a bonding pad electrically connected to the conductor film. In a plan view from a direction normal to the first main surface of the substrate, the plurality of trench portions are arranged in second regions disposed along a second direction and not in first regions disposed along a first direction in which a bonding wire electrically connected to the bonding pad extends.

19 Claims, 8 Drawing Sheets

(56) References Cited

U.S. PATENT DOCUMENTS

| | | | |
|---|---|---|---|
| 2003/0045088 A1* | 3/2003 | Imai | H01L 24/48 |
| | | | 438/622 |
| 2008/0023843 A1* | 1/2008 | Hiraga | H01L 24/49 |
| | | | 257/773 |
| 2010/0018645 A1 | 1/2010 | Flippin et al. | |
| 2011/0067495 A1* | 3/2011 | Yu | G01P 15/0888 |
| | | | 73/514.24 |
| 2012/0326207 A1* | 12/2012 | Yoshimochi | H01L 21/763 |
| | | | 257/139 |
| 2014/0145301 A1* | 5/2014 | Moghe | H01L 27/0292 |
| | | | 257/532 |
| 2015/0305159 A1* | 10/2015 | Yamamoto | H01G 4/40 |
| | | | 361/767 |
| 2016/0293334 A1 | 10/2016 | Ehara et al. | |
| 2017/0278841 A1* | 9/2017 | Palumbo | H01L 23/5222 |
| 2018/0047807 A1* | 2/2018 | Ho | H01L 27/0629 |
| 2018/0247893 A1* | 8/2018 | Kayashima | H01L 23/5223 |
| 2018/0315819 A1* | 11/2018 | Tanaka | H01L 29/0623 |

FOREIGN PATENT DOCUMENTS

| | | | |
|---|---|---|---|
| JP | 2014049729 A | 3/2014 | |
| JP | 5522077 B2 | 6/2014 | |
| JP | 2016195164 A | 11/2016 | |

OTHER PUBLICATIONS

Written Opinion of the International Searching Authority issued for PCT/JP2018/032218, dated Nov. 20, 2018.

* cited by examiner

CAPACITOR

CROSS REFERENCE TO RELATED APPLICATIONS

The present application is a continuation of International application No. PCT/JP2018/032218, filed Aug. 30, 2018, which claims priority to Japanese Patent Application No. 2017-178826, filed Sep. 19, 2017, the entire contents of each of which are incorporated herein by reference.

FIELD OF THE INVENTION

The present invention relates to a capacitor.

BACKGROUND OF THE INVENTION

Capacitors are required to have an increased capacitance density due to the requirements for increased functionality and downsizing of electronic devices on which capacitors are mounted. For example, Patent Document 1 discloses a semiconductor device including a plurality of capacitor structures each of which is disposed in a through hole of a substrate and in each of which a dielectric and an outer conductor are coaxially arranged around a central conductor; and an upper surface wiring formed on the front side of the substrate and electrically connected to the central conductor, in which the upper surface wiring serves as a connection terminal, and the connection terminal is connected to an external terminal via a bonding wire. This can increase capacitance in the capacitor structure without increasing the chip area.

Incidentally, a connection terminal (bonding pad) of such a capacitor and a bonding wire are connected with each other using, for example, ultrasonic waves. In wire bonding using ultrasonic waves, a bonding wire and a bonding pad are joined together by pressing the bonding wire against the bonding pad and applying ultrasonic waves such that the joint portion between the bonding wire and the bonding pad vibrates in one direction. A typical vibration direction of the ultrasonic waves is in the extending direction of the bonding wire.

Patent Document 1: Japanese Patent No. 5522077

SUMMARY OF THE INVENTION

As illustrated in Patent Document 1, in the case where the bonding pad and the capacitor structure are arranged along the extending direction of the bonding wire, the capacitor structure may be damaged by the ultrasonic waves during wire bonding.

The present invention has been made in view of such circumstances, and an object thereof is to provide a capacitor having improved reliability.

A capacitor according to an aspect of the present invention includes a substrate having a first main surface and a second main surface that are opposite to each other, and a plurality of trench portions on the first main surface; a dielectric film adjacent the first main surface of the substrate and extending into interiors of the plurality of trench portions; a conductor film on the dielectric film and extending into the interiors of the plurality of trench portions; and a bonding pad electrically connected to the conductor film. In a plan view from a direction normal to the first main surface of the substrate, the plurality of trench portions are arranged in second regions disposed along a second direction and not in first regions disposed along a first direction in which a bonding wire electrically connected to the bonding pad extends, the first regions and the second regions being located in a peripheral region of the bonding pad, and the first direction and the second direction intersecting each other.

A capacitor according to another aspect of the present invention includes a substrate having a first main surface and a second main surface that are opposite to each other, and a plurality of trench portions on the first main surface; a dielectric film adjacent the first main surface of the substrate and extending into interiors of the plurality of trench portions; a conductor film disposed on the dielectric film and extending into the interiors of the plurality of trench portions; and a bonding pad electrically connected to the conductor film. In a plan view from a direction normal to the first main surface of the substrate, each of the plurality of trench portions has a shape of an aperture elongated in a first direction.

A capacitor according to yet another aspect of the present invention includes a substrate having a first main surface and a second main surface that are opposite to each other, and a plurality of trench portions on the first main surface; a dielectric film adjacent the first main surface of the substrate and extending into interiors of the plurality of trench portions; a conductor film disposed on the dielectric film and extending into the interiors of the plurality of trench portions; and a bonding pad electrically connected to the conductor film. In a plan view from a direction normal to the first main surface of the substrate, the plurality of trench portions are arranged in first regions disposed along a first direction in which the bonding wire extends and second regions disposed along a second direction such that a first aperture area density of the first regions is smaller than a second aperture area density of the second regions, the first regions and the second regions being located in a peripheral region of the bonding pad, and the first direction and the second direction intersecting each other.

According to the present invention, it is possible to provide a capacitor having improved reliability.

DETAILED DESCRIPTION OF THE INVENTION

Hereinafter, embodiments of the present invention will be described with reference to the drawings. However, in the second and subsequent embodiments, the same or similar components as those in the first embodiment are denoted by the same or similar reference signs as those in the first embodiment, and detailed descriptions thereof will be omitted as appropriate. In addition, regarding effects obtained in the second and subsequent embodiments, the description of the same effects as in the first embodiment will be omitted as appropriate. Since the figures used in each embodiment are merely examples, and the dimensions and shapes of each part therein are schematic illustrations, the technical scope of the present invention should not be limited to those embodiments.

First Embodiment

Figure 1:
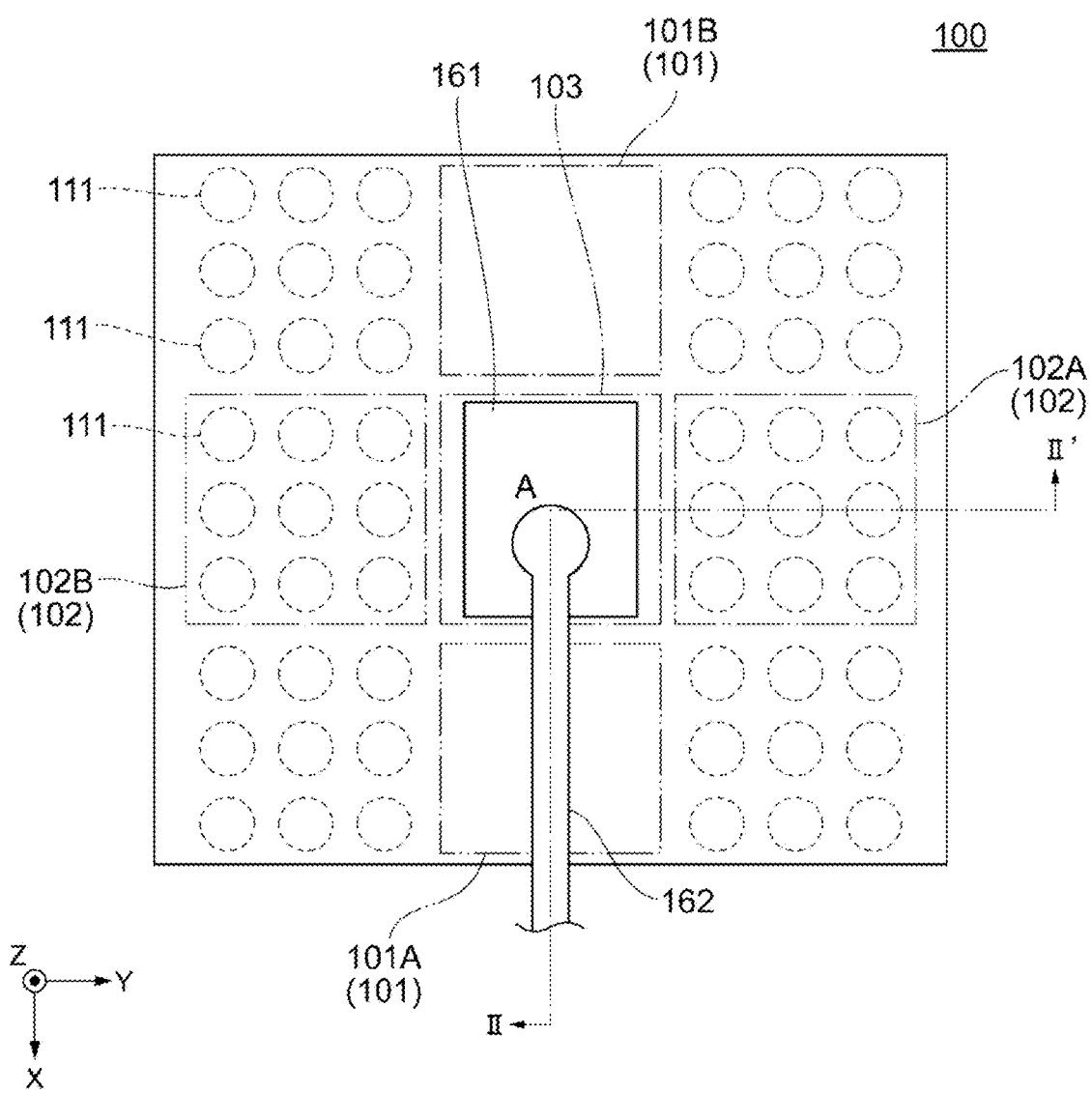
FIG. 1 is a plan view schematically showing a configuration of a capacitor according to a first embodiment.
Figure 2:
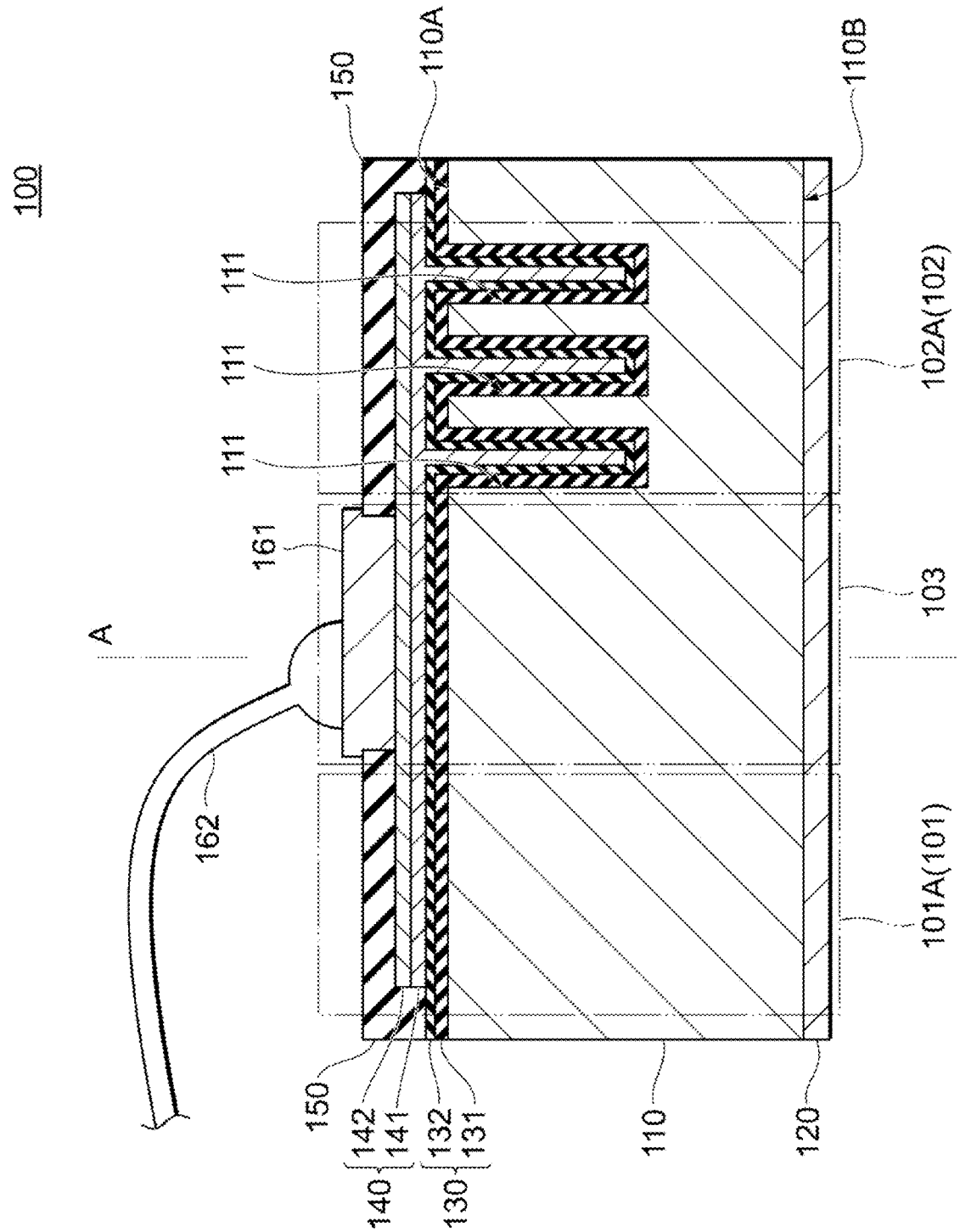
FIG. 2 is a sectional view schematically showing a sectional configuration of the capacitor taken along line II-II' shown in FIG. 1.

First, a configuration of a capacitor 100 according to a first embodiment of the present invention will be described with reference to FIGS. 1 and 2. FIG. 1 is a plan view schematically showing the configuration of the capacitor according to the first embodiment. FIG. 2 is a sectional view schematically showing a sectional configuration along line II-II' of the capacitor shown in FIG. 1.

A first direction X, a second direction Y, and a third direction Z shown in the figures are directions orthogonal to one another, but are not limited to these directions as long as they intersect one another. The directions may intersect one another at any angle other than 90°. Further, the first direction X, the second direction Y, and the third direction Z are different directions intersecting one another, and the directions are not limited to the positive directions of the arrows shown in FIG. 1, and also include the negative directions opposite to the directions of the arrows.

The capacitor 100 includes first regions 101, second regions 102, and a third region 103 in a plan view from a direction normal to a first main surface 110A of a substrate 110. The third region 103 is a region that overlaps a bonding pad 161 to be described later, and indicates a region that is substantially the same size as the bonding pad 161 in a plan view from the direction normal to the first main surface 110A of the substrate 110. The first regions 101 are regions along the first direction X in a peripheral region of the bonding pad 161. The second regions 102 are regions along the second direction Y in the peripheral region of the bonding pad 161. The first regions 101 are aligned with the third region 103 in the first direction X, and the second regions 102 are aligned with the third region 103 in the second direction Y.

The first regions 101 include a first partial region 101A located on the positive side in the first direction X with respect to the third region 103, and a second partial region 101B located on the negative side in the first direction X with respect to the third region 103. The first partial region 101A and the second partial region 101B are adjacent to the third region 103 in the first direction X.

As an example, the first partial region 101A and the second partial region 101B have a width along the second direction Y equal to that of the third region 103, and a width along the first direction X equal to that of the third region 103.

The second regions 102 include a third partial region 102A located on the positive side in the second direction Y with respect to the third region 103, and a fourth partial region 102B located on the negative side in the second direction Y with respect to the third region 103. The third partial region 102A and the fourth partial region 102B are adjacent to the third region 103 in the second direction Y.

As an example, the third partial region 102A and the fourth partial region 102B have a width along the first direction X equal to that of the third region 103, and a width along the second direction Y equal to that of the third region 103. Note that each of the first partial region 101A, the second partial region 101B, the third partial region 102A, and the fourth partial region 102B may have a larger area than the third region 103, and may be a band-like region extending from an end of the third region 103 to an end of the capacitor 100.

The capacitor 100 includes the substrate 110, a first conductor film 120, a dielectric film 130, a second conductor film 140, an insulator film 150, and the bonding pad 161. The capacitor 100 is connected with a bonding wire 162.

The substrate 110 has, for example, a single layer structure made of a conductive low resistance silicon substrate. The substrate 110 has the first main surface 110A on the positive side in the third direction Z, and a second main surface 110B on the negative side in the third direction Z. The first main surface 110A is, for example, a crystal plane whose crystal orientation is represented as <100>. The first main surface 110A and the second main surface 110B are surfaces parallel to the surface specified by the first direction X and the second direction Y (hereinafter referred to as an "XY-plane"). The substrate 110 may be an insulating substrate made of crystal or the like. Further, the substrate 110 may have a laminated structure, for example, a laminated body including a conductive substrate and an insulator film.

The substrate 110 has a plurality of trench portions 111 formed on the first main surface 110A. Each of the trench portions 111 is a bottomed depression having an aperture on the first main surface 110A, and the bottom thereof is formed in a circular shape in a top view. The trench portions 111 each have a depth of 10 μm to 50 μm, and a bottom diameter of about 5 μm. The trench portions are provided in the region where the capacitance is formed, which increases the facing area of the electrodes, so that the capacitance value of the capacitor 100 can be increased without increasing the size of the capacitor 100. Note that the shape and the size of the trench portions 111 are not limited to the above. The shape of the trench portions 111 may be, for example, an elliptical cylinder shape, a polygonal cylinder shape, a groove shape, or a combination of these shapes. A method of forming the trench portions 111 is not limited, but the trench portions 111 can be formed with a high aspect ratio by dry etching using photolithography, so that the trench portions 111 can be provided with higher density.

In this embodiment, the trench portions 111 are formed in the second regions 102, and not in the first regions 101. The trench portions 111 are also formed in regions along the first direction X from the second regions 102. The number of trench portions 111 formed in the second regions 102 is not limited to a particular number as long as at least one trench portion 111 is formed in the second regions 102.

The trench portion may also be provided on the second main surface 110B of the substrate 110. The trench portion on the second main surface 110B may be formed in any of the first regions 101, the second regions 102, and the third region 103. However, even in the case of being formed on the second main surface 110B, the trench portion is desirably not formed in the first regions 101 as in the case of being formed on the first main surface 110A.

The first conductor film 120 covers the second main surface 110B of the substrate 110. The first conductor film 12 is made of a metal material, for example, molybdenum (Mo), aluminum (Al), gold (Au), silver (Ag), copper (Cu), tungsten (W), platinum (Pt), titanium (Ti), nickel (Ni), or chromium (Cr). The material of the first conductor film 120 is not limited to a metal material, and the first conductor film 120 may be formed of any conductive material, such as a conductive resin. When the substrate 110 is a low resistance silicon substrate, the first conductor film 120 and the substrate 110 function as a lower electrode of the capacitor 100, respectively. In the case where the substrate 110 is an insulating substrate, the first conductor film, the dielectric film covering the first conductor film, and the second conductor film covering the dielectric film are formed inside the trench portions 111. That is, the capacitor is formed on the first main surface 110A of the substrate 110.

The dielectric film 130 is disposed adjacent the first main surface 110A in a region including the interiors of the plurality of trench portions 111. The dielectric film 130 has a first dielectric layer 131 and a second dielectric layer 132.

The first dielectric layer 131 covers the first main surface 110A of the substrate 110 and the bottom surfaces and the inner surfaces of the trench portions 111. The first dielectric layer 131 is formed of an insulating silicon oxide (for example, $SiO_2$). The first dielectric layer 131 has a thickness of, for example, about 0.3 μm. In the case where the substrate 110 is a silicon substrate, the first dielectric layer 131 can be formed as a surface oxide film of the silicon substrate by thermally oxidizing the substrate 110. The first dielectric layer 131 can improve its adhesion with the substrate 110 that is the base of the dielectric film 130.

The second dielectric layer 132 is provided on the first dielectric layer 131. The second dielectric layer 132 is provided not only above the first main surface 110A of the substrate 110 but also inside the spaces formed by the trench portions 111 on the first main surface 110A of the substrate 110. The second dielectric layer 132 is formed of a silicon nitride-based dielectric material, such as silicon oxynitride (SiON) or silicon nitride ($Si_3N_4$). The second dielectric layer 132 has a thickness of, for example, about 1 μm. The second dielectric layer 132 is provided by a vapor deposition method, such as chemical vapor deposition (CVD) or physical vapor deposition (PVD). The second dielectric layer 132 is formed of a dielectric having a dielectric constant higher than that of the first dielectric layer 131, so that the capacitance density of the capacitor 100 can be improved. Further, since the first dielectric layer 131 is made of a silicon oxide film having a compressive stress and the second dielectric layer 132 is made of silicon nitride having a tensile stress, the dielectric film 130 can relieve its internal stress. In this manner, one of the first dielectric layer 131 and the second dielectric layer 132 has a compressive stress and the other has a tensile stress, thereby suppressing damage to the capacitor 100 due to the internal stress of the dielectric film 130.

The dielectric film 130 may have a multilayer structure including three or more layers including another dielectric layer. By allowing the second dielectric layer 132 to have a multilayer structure, the capacitance value, the breakdown voltage, the internal stress, etc. can be adjusted more freely. The first dielectric layer 131 is not limited to a silicon oxide-based dielectric material, and may be formed of a dielectric material made of other oxides, silicon nitride, or the like. Further, the second dielectric layer 132 is not limited to a silicon nitride-based dielectric material, and may be formed of a dielectric material made of an oxide, such as $Al_2O_3$, $HfO_2$, $Ta_2O_5$, $ZrO_2$, for example.

The dielectric film 130 may have a single layer structure that has a sufficient thickness (for example, 1 μm or more). However, the thickness of the dielectric film 130 needs to be smaller than the depth and the width of the trench portions 111. This is to avoid a situation in which the internal spaces of the trench portions 111 are filled with the dielectric film 130. That is, it is possible to suppress a decrease in the capacitance density of the capacitor 100 due to a decrease in the facing area of the electrodes.

The second conductor film 140 is disposed on the dielectric film 130 in a region including the interiors of the trench portions 111. The second conductor film 140 functions as an upper electrode of the capacitor 100, and capacitance is formed between the upper electrode and the lower electrode (the substrate 110 and the first conductor film 120). That is, the area where the substrate 110 and the second conductor film 140 face each other with the dielectric film 130 interposed therebetween corresponds to the facing area of the electrodes in the capacitor 100.

The second conductor film 140 includes a first conductor layer 141 and a second conductor layer 142. The first conductor layer 141 is formed on the dielectric film 130, and is also provided inside the spaces formed by the trench portions 111 on the first main surface 110A of the substrate 110. The first conductor layer 141 is, for example, a p-type or n-type polycrystalline silicon (Poly-Si) film. The second conductor layer 142 is provided on the first conductor layer 141. The second conductor layer 142 is formed of, for example, the metal materials mentioned in the description of the first conductor film 120. The second conductor layer 142 is not limited to a metal material, and may be formed of a conductive material, such as a conductive resin. The first conductor layer 141 and the second conductor layer 142 are formed by a vapor deposition method, such as CVD or PVD, for example.

The insulator film 150 covers the end of the second conductor film 140 in a plan view from the direction normal to the first main surface 110A of the substrate 110. The insulator film 150 exposes the second conductor film 140 in the third region 103. The insulator film 150 is, for example, a polyimide (PI) film, but may be another organic insulator film or an inorganic insulator film formed of silicon oxide, silicon nitride, or the like. The insulator film 150 can suppress the generation of a leakage current due to creeping discharge.

That is, the breakdown voltage of the capacitor 100 can be increased. Further, the insulator film 150 can suppress damage to the dielectric film 130 by transmitting the internal stress of the second conductor film 140 to the dielectric film 130. Note that when the dielectric constant of the insulator film 150 is larger than that of the dielectric film 130, a leakage electric field from the second conductor film 140 can be suppressed. On the other hand, when the dielectric constant of the insulator film 150 is smaller than that of the dielectric film 130, formation of parasitic capacitance by the second conductor film 140 can be suppressed.

The bonding pad 161 is disposed on the second conductor film 140 in the third region 103 and is electrically connected to the second conductor film 140. The configuration of the bonding pad 161 is not limited. For example, the bonding pad 161 may be disposed on the insulator film 150 and electrically connected to the second conductor film 140 through a via hole penetrating the insulator film 150, or the second conductor film 140 exposed in the third region 103 may function as the bonding pad 161.

The bonding pad 161 desirably has an isotropic thermal expansion coefficient in order to disperse a load on the capacitor 100 due to thermal stress, but may have an anisotropic thermal expansion coefficient. In the capacitor 100, the region overlapping the bonding pad 161 (third region 103) includes no trench portions 111, while in the peripheral region of the bonding pad 161, the first regions 101 include no trench portions 111, and the second regions 102 include the trench portions 111. Thus, rigidity against displacement in the first direction X is higher than that in the second direction Y. Further, the internal stress tends to concentrate on the corners of the trench portions 111. In view of the above, when the bonding pad 161 has an anisotropic thermal expansion coefficient, it is desirable to design the bonding pad 161 such that the thermal expansion coefficient becomes larger in the first direction X than in the second direction Y. This can suppress damage to the capacitor 100 due to thermal stress caused by the bonding pad 161, for example, generation of leakage current resulting from damage to the dielectric film 130.

The bonding wire 162 is electrically connected to the bonding pad 161 and extends from the joint portion with the bonding pad 161 to the positive side in the first direction X. The bonding wire 162 is made of Cu or Al, for example. The capacitor 100 according to the present embodiment employs a configuration that does not include the bonding wire 162. However, the capacitor 100 according to the present embodiment may include the bonding wire 162. In the case where the capacitor 100 does not include the bonding wire 162, the first direction X corresponds to an extending direction of the bonding wire 162 that is to be electrically connected to the bonding pad 161. In the case where the capacitor 100 includes the bonding wire 162, the first direction X corresponds to an extending direction of the bonding wire 162 electrically connected to the bonding pad 161.

The bonding wire 162 is joined to the bonding pad 161 by wire bonding using ultrasonic waves. In the present embodiment, the wire bonding includes a step of pressing the bonding wire 162 against the bonding pad 161, a step of applying ultrasonic waves that vibrate in a direction along the first direction X at the contact portion between the bonding pad 161 and the bonding wire 162, and a step of routing the bonding wire 162 along the third direction Z and the first direction X. The contact portion between the bonding pad 161 and the bonding wire 162 is joined by ultrasonic vibration energy. Since the capacitor 100 has rigidity against displacement in the first direction X higher than that in the second direction Y, the capacitor 100 has high durability against ultrasonic vibration during wire bonding. That is, damage to the capacitor 100 due to wire bonding can be suppressed.

In the case where the capacitor 100 is a Cu wire or a thick wire used for power devices, a larger pressure is required to press the bonding wire 162 against the bonding pad 161 in wire bonding. In addition, larger vibration energy of the ultrasonic waves is required to join the contact portion between the bonding pad 161 and the bonding wire 162. In addition, larger tension is required to route the bonding wire 162. That is, in the case of a Cu wire, a thick wire, or a bonding ribbon, the physical load on the capacitor 100 increases during a wire bonding process, so it is more effective to adopt the aspect according to the present embodiment.

In the above description, the configuration in which the trench portions are formed in an independent capacitor element has been described as an example, but the aspect of the present embodiment is not limited thereto. For example, the configuration of the capacitor according to the present embodiment may be applied to a partial region of a board (for example, an interposer or a motherboard) that includes another electronic element (for example, a passive element or an active element) mounted on the surface thereof or formed therein. In other words, the capacitor according to the present embodiment is not limited to an independent device having only a function as a capacitor, but may be a device having a function of a capacitor and other electronic elements.

Further, the present embodiment describes an aspect in which the trench portions 111 are formed in the second regions 102 avoiding the first regions 101, with reference to the first regions 101 and the second regions 102 having substantially the same width as the bonding pad 161. However, the size of each region in a plan view is not limited to the above aspect as long as the trench portions 111 on the first main surface 11A are disposed in the second regions while avoiding the first regions along the first direction (the direction along the extending direction of the bonding wire 162, i.e., the direction X in FIG. 1) with respect to the bonding pad 161.

Next, other embodiments will be described. In each of the following embodiments, description of the matters common to the first embodiment will be omitted, and only the points different from the first embodiment will be described. The configurations denoted by the same reference numerals as those in the first embodiment are assumed to have the same configurations and functions as the configurations in the first embodiment, and detailed description thereof will be omitted. Similar effects obtained by similar configurations will not be mentioned.

Second Embodiment

Figure 3:
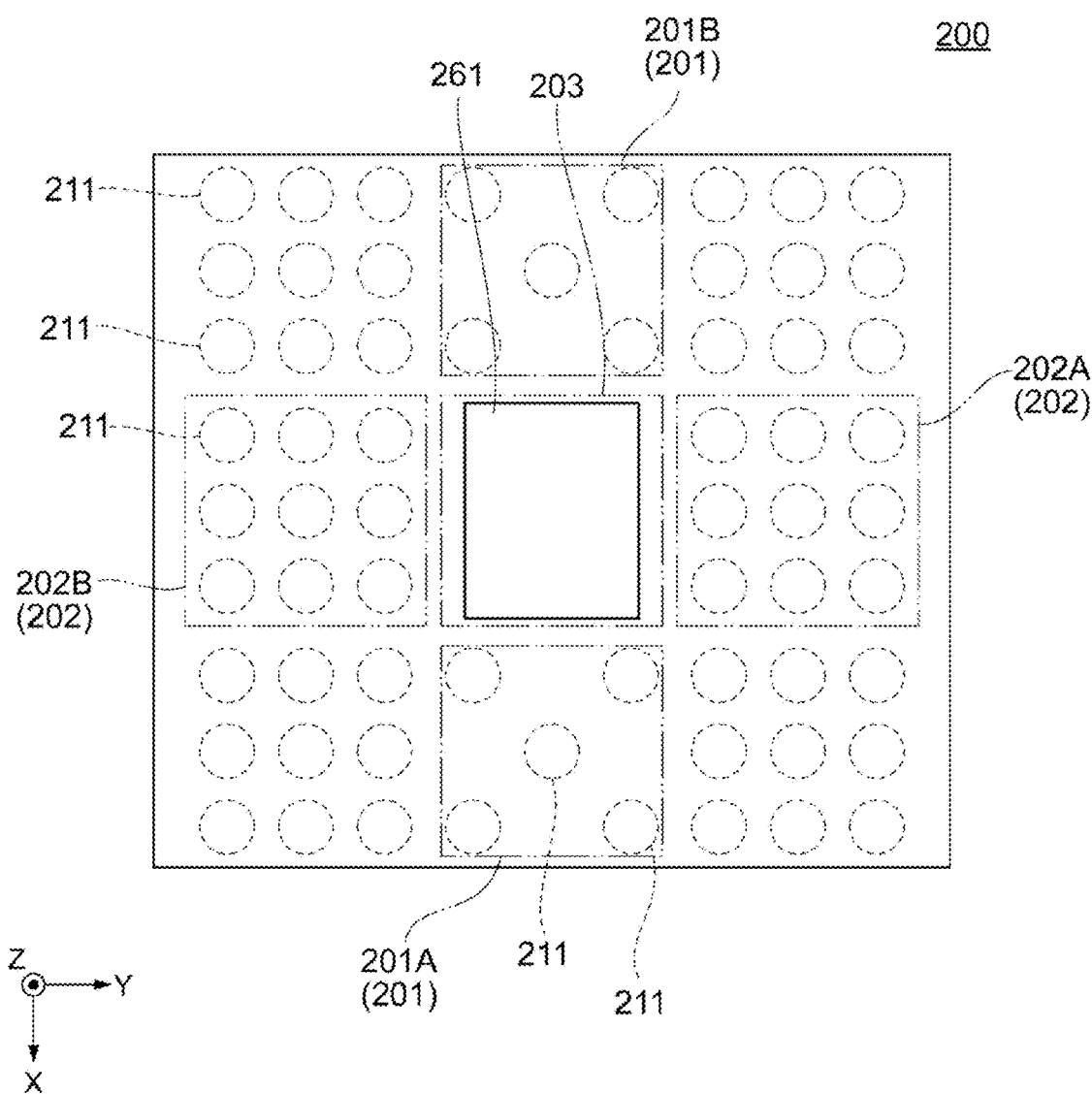
FIG. 3 is a plan view schematically showing a configuration of a capacitor according to a second embodiment.

A configuration of a capacitor 200 according to a second embodiment will be described with reference to FIG. 3. FIG. 3 is a plan view schematically showing the configuration of the capacitor according to the second embodiment.

The capacitor 200 according to the second embodiment differs from the capacitor 100 according to the first embodiment in that a plurality of trench portions 211 are provided such that the number thereof in the first regions 201 is smaller than that in the second regions 202. That is, the plurality of trench portions 211 are also provided in the first regions 201 such that the aperture area density in the first regions 201 is smaller than that in the second regions 202. Note that the aperture area corresponds to the area occupied by the apertures of the trench portions 211 on the XY-plane including the first main surface of the substrate.

The aperture area of each of the plurality of trench portions 211 in the first regions 201 is substantially the same as that in the second regions 202. An interval between adjacent trench portions 211 is wider in the first regions 201 than in the second regions 202.

For this reason, rigidity of the first regions 201 is higher than that of the second regions 202. Note that the aperture area density of the plurality of trench portions 211 in a first partial region 201A may be different from that in a second partial region 201B. For example, rigidity of the first partial region 201A can be made higher than that of the second partial region 201B by making the aperture area density in the first partial region 201A smaller than that in the second partial region 201B. That is, damage to the capacitor 200 due to the tension at the time of routing the bonding wire can be suppressed. Note that the shape of the aperture of each trench portion 211 in the first regions 201 may be different from that in the second regions 202, and this is applied to the other embodiments.

Third Embodiment

Figure 4:
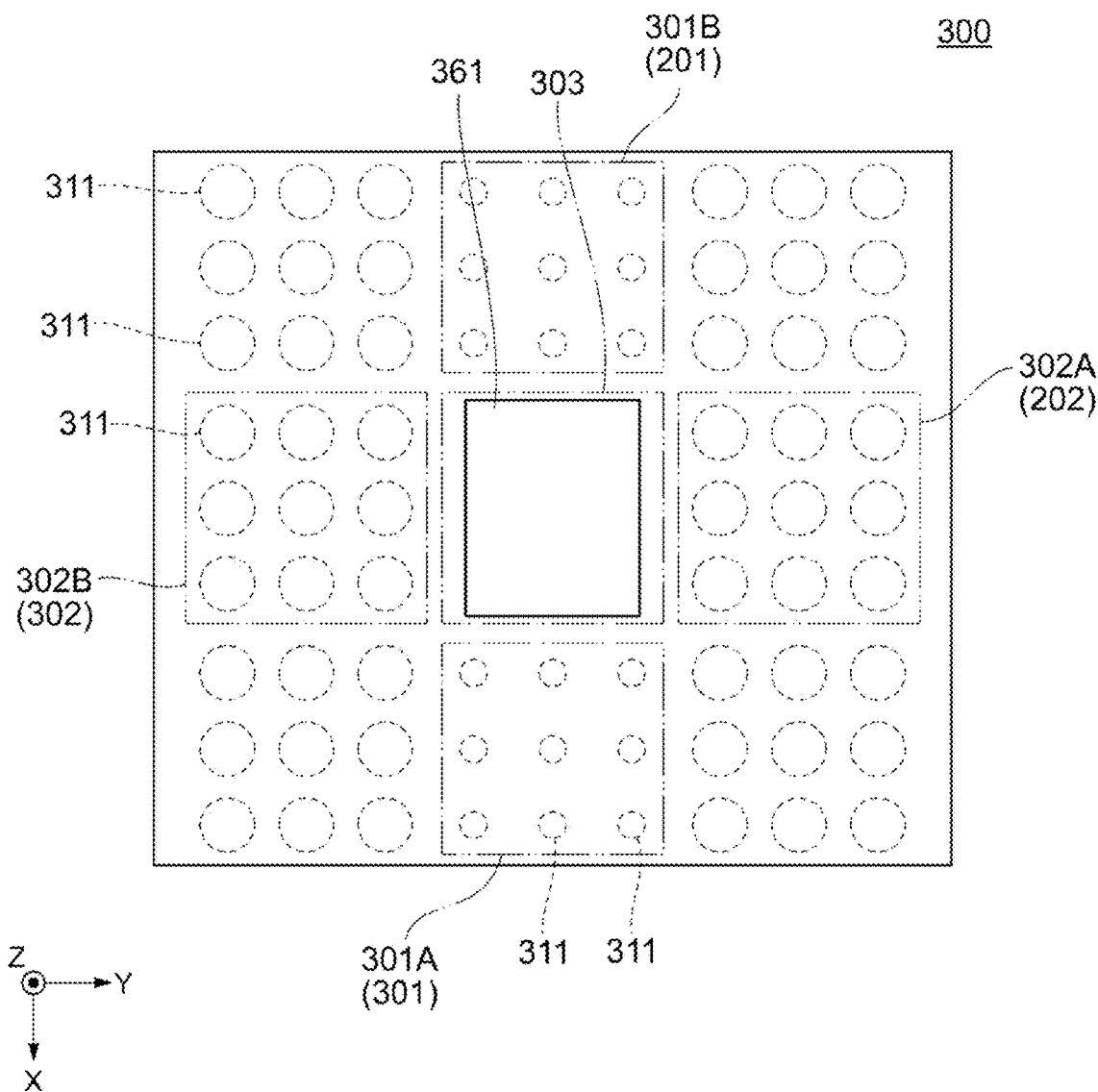
FIG. 4 is a plan view schematically showing a configuration of a capacitor according to a third embodiment.

The configuration of a capacitor 300 according to a third embodiment will be described with reference to FIG. 4. FIG.

4 is a plan view schematically showing the configuration of the capacitor according to the third embodiment.

The capacitor 300 according to the third embodiment differs from the capacitor 100 according to the first embodiment in that a plurality of trench portions 311 are provided such that each aperture area in first regions 301 is smaller than that in second regions 302. Further, the number of the plurality of trench portions 311 in the first regions 201 is the same as that in the second regions 202. That is, the aperture area density of the plurality of trench portions 311 is smaller in the first regions 301 than in the second regions 302.

The trench portions 311 only needs to be smaller in size in the first regions 301 than in the second regions 302. Accordingly, the depth in the third direction Z of each trench portion 311 in the first regions 301 may be smaller than that in the second regions 302. When the depth of each of the trench portions 311 in the first regions 301 is smaller than that in the second regions 302, the trench portions 311 may have the same aperture area both in the first regions 301 and in the second regions 302. The plurality of trench portions 311 are arranged in the same manner in the first regions 301 and in the second regions 302, but may be arranged differently.

Fourth Embodiment

Figure 5:
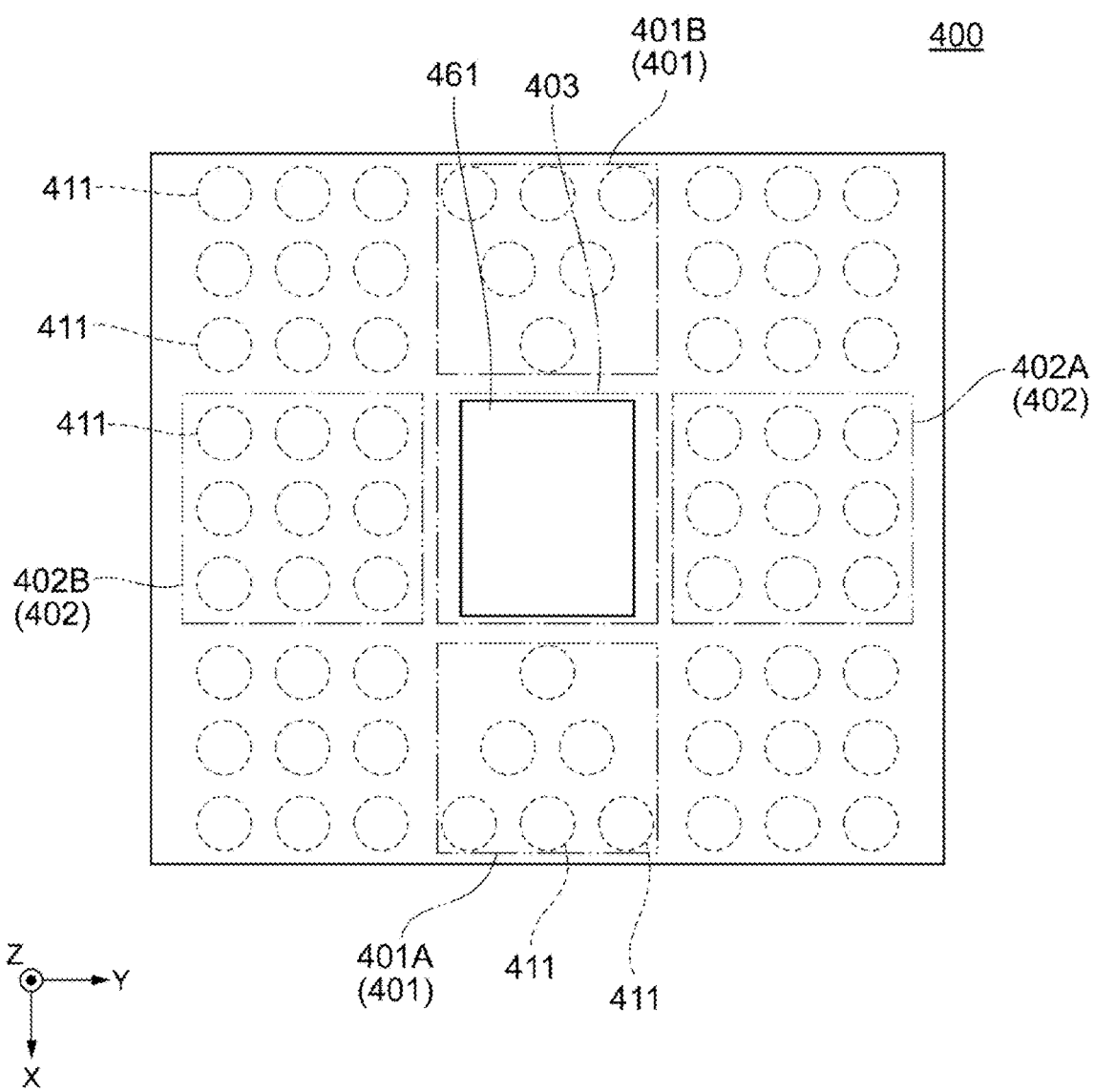
FIG. 5 is a plan view schematically showing a configuration of a capacitor according to a fourth embodiment.

The configuration of a capacitor 400 according to a fourth embodiment will be described with reference to FIG. 5. FIG. 5 is a plan view schematically showing the configuration of the capacitor according to the fourth embodiment.

The capacitor 400 according to the fourth embodiment differs from the capacitor 200 according to the second embodiment in that trench portions 411 are arranged such that the number thereof in the second direction Y in each first region 301 decreases as the distance from a bonding pad 461 decreases. Specifically, in a first partial region 401A, one trench portion 411 is formed in the row closest to the bonding pad 461 (hereinafter, the arrangement along the second direction Y is referred to as a "row"), two trench portions 411 are formed in the row second closest to the bonding pad 461, and three trench portions 411 are formed in the row farthest from the bonding pad 461. The trench portions 411 are formed to have the same shape and the same aperture area. The same is applied to the trench portions 411 in a second partial region 401B. However, the above arrangement is merely an example, and the arrangement of the trench portions 411 is not limited as long as the aperture area density thereof decreases as the distance from the bonding pad 461 decreases. With this configuration, rigidity of first regions 401 can be made higher than that of second regions 402 while suppressing reduction in the capacitance value caused by limiting the number of the trench portions 411 in the first regions 401 compared to the second regions 402.

Fifth Embodiment

Figure 6:
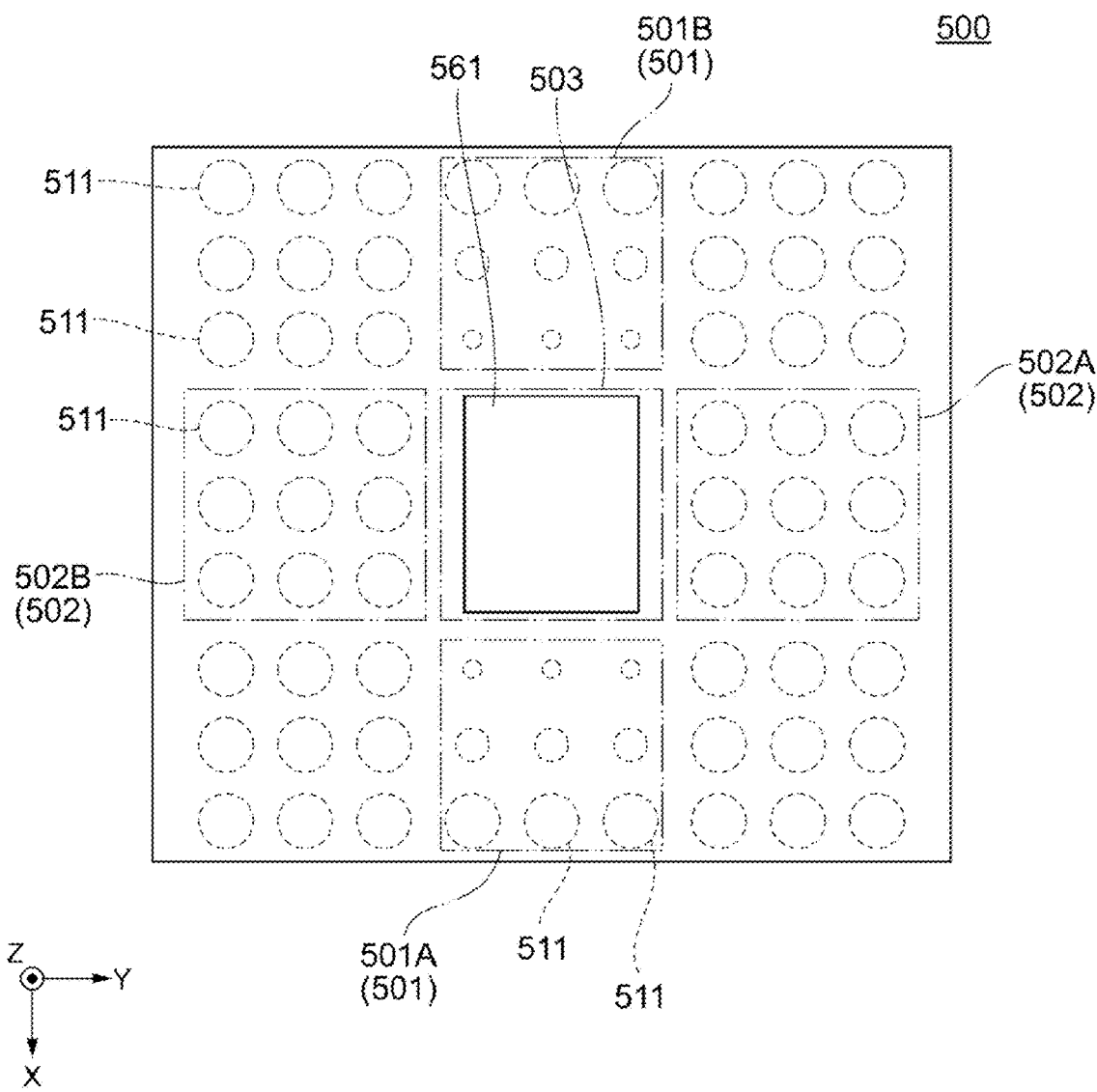
FIG. 6 is a plan view schematically showing a configuration of a capacitor according to a fifth embodiment.

The configuration of a capacitor 500 according to a fifth embodiment will be described with reference to FIG. 6. FIG. 6 is a plan view schematically showing the configuration of the capacitor according to the fifth embodiment.

The capacitor 500 according to the fifth embodiment differs from the capacitor 300 according to the third embodiment in that trench portions 511 are arranged such that the aperture areas thereof in the second direction Y in first regions 501 decrease as the distance from a bonding pad 561 decreases. Specifically, in a first partial region 501A, the trench portions 511 arrayed in the row closest to the bonding pad 561 have an aperture area smaller than the trench portions 511 arrayed in the row second closest to the bonding pad 561. In the first partial region 501A, the trench portions 511 arrayed in the row farthest from the bonding pad 561 have an aperture area larger than the trench portions 511 arrayed in the other rows. That is, in the first regions 501, the aperture area density of the trench portions 511 is smaller as the distance from the bonding pad 561 decreases. This embodiment provides the same effect as described in the fourth embodiment.

Sixth Embodiment

Figure 7:
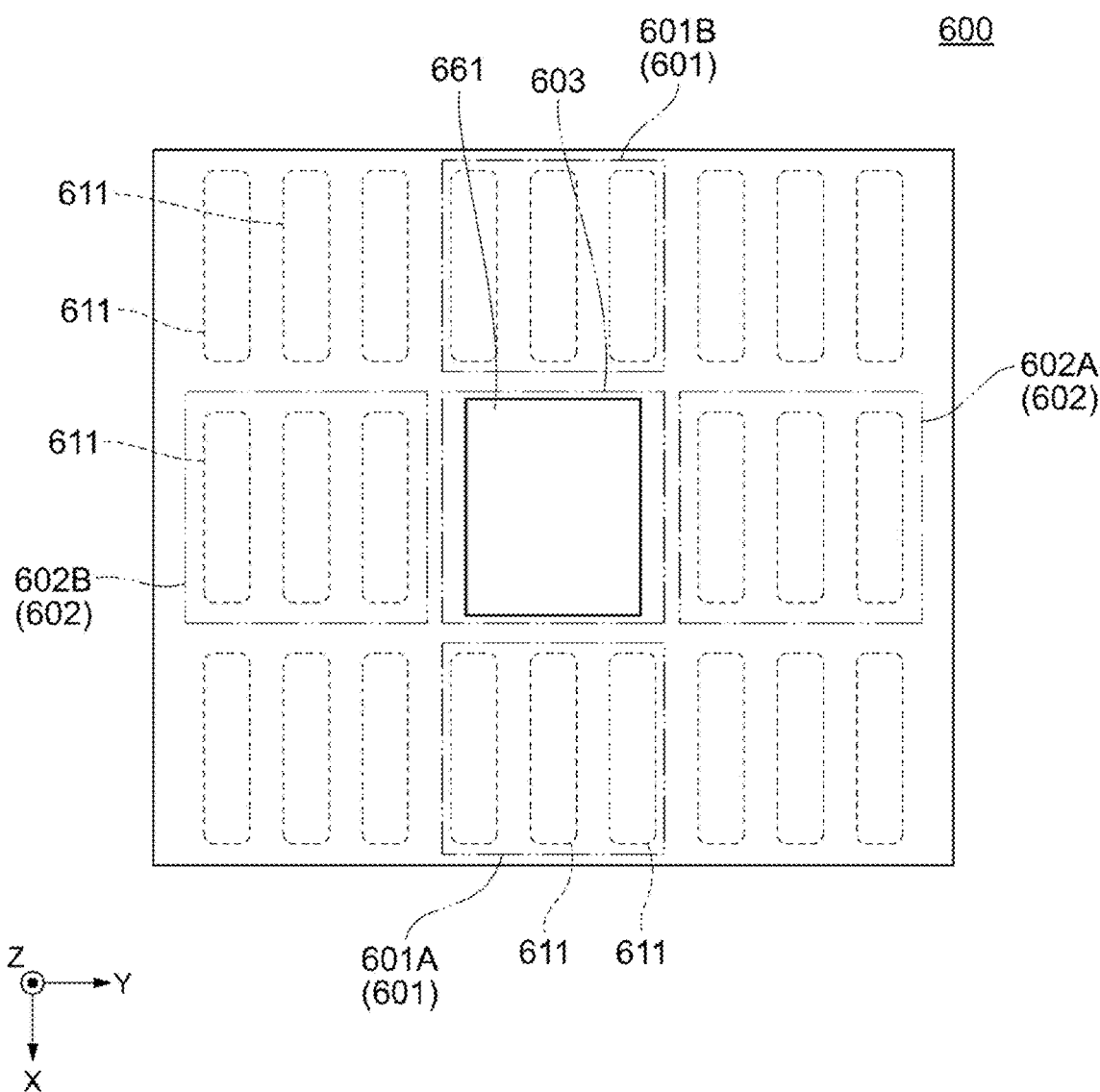
FIG. 7 is a plan view schematically showing a configuration of a capacitor according to a sixth embodiment.

The configuration of a capacitor 600 according to a sixth embodiment will be described with reference to FIG. 7. FIG. 7 is a plan view schematically showing the configuration of the capacitor according to the sixth embodiment.

The capacitor 600 according to the sixth embodiment differs from the capacitor 100 according to the first embodiment in that trench portions 611 each have a shape of an aperture elongated in the first direction X, and the trench portions 611 are formed also in first regions 601 as well as in second regions 602. With this configuration, in the region including a bonding pad 661 (third region 603) and in a peripheral region of the bonding pad 661, rigidity against displacement in the first direction X is higher than that in the second direction Y.

Seventh Embodiment

Figure 8:
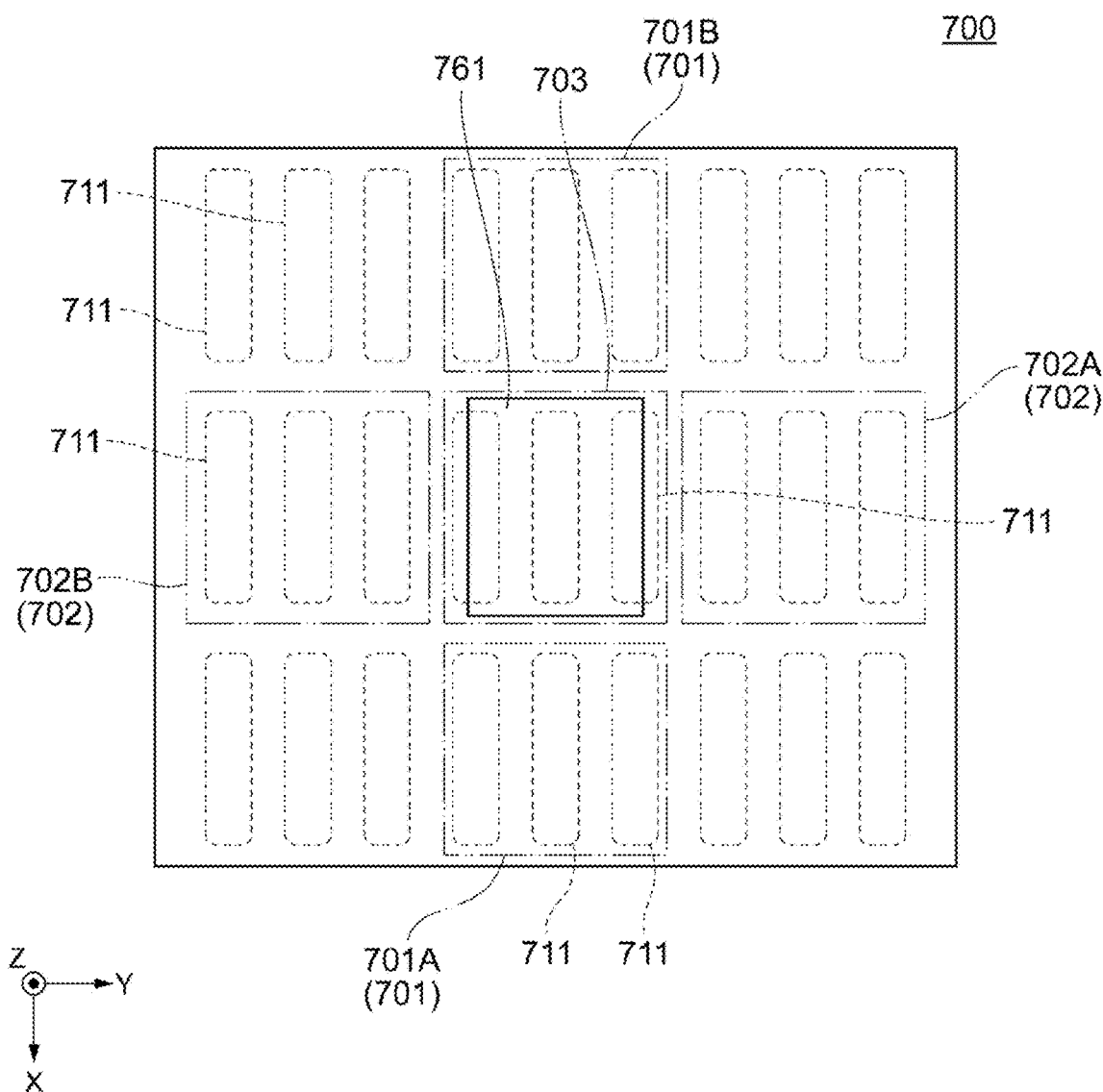
FIG. 8 is a plan view schematically showing a configuration of a capacitor according to a seventh embodiment.

The configuration of a capacitor 700 according to a seventh embodiment will be described with reference to FIG. 8. FIG. 8 is a plan view schematically showing the configuration of the capacitor according to the seventh embodiment.

The capacitor 700 according to the seventh embodiment differs from the capacitor 600 according to the sixth embodiment in that a third region 703 also includes trench portions 711. In the illustrated example, the trench portions 711 have the same number, aperture area, arrangement, and aperture shape in any of first regions 701, second regions 702, and the third region 703, but may have different numbers, aperture areas, arrangements, or aperture shapes for different regions. It is desirable that the aperture area density of the plurality of trench portions 711 in the first regions 701 is lower than that in the second regions 702 and the aperture area density in the third region 703 is equal to or lower than that in the first regions 701 so that rigidity in the first direction X is made higher than that in the second direction Y in a region of a bonding pad 761 (third region 703) and in the peripheral region of the bonding pad 761. That is, it is desirable to satisfy the inequality, D702>D701≥D703, where the aperture area densities of the first regions 701, the second regions 702, and the third region 703 are denoted as D701, D702, and D703, respectively. For example, the trench portions 711 may be arranged such that the number thereof in each of the first regions 701 is larger than that in the third region 703, and the number thereof in each of the second regions 702 is larger than that in each of the first regions 701. Note that the third region may include the trench portions also in the other embodiments.

As described above, one aspect of the present invention provides a capacitor 100 including: a substrate 110 having a first main surface 110A and a second main surface 110B that are opposite to each other, and including a plurality of trench portions 111 on the first main surface 110A; a dielectric film 130 disposed adjacent the first main surface 110A of the substrate 110 in a region including interiors of the plurality of trench portions 111; a conductor film 140 disposed in a region including the interiors of the plurality of trench portions 111 and on the dielectric film 130; and a bonding pad 161 electrically connected to the conductor film 140, in which, in a plan view from a direction normal to the first main surface 110A of the substrate 110, the plurality of trench portions 111 are arranged in second regions 102 disposed along a second direction Y while avoiding first regions 101 disposed along a first direction X in which a bonding wire 162 electrically connected to the bonding pad 161 is extended, the first regions 101 and the second regions 102 being located in a peripheral region of the bonding pad 161, the first direction X and the second direction Y intersecting each other.

With this aspect, in a region including the bonding pad and in the peripheral region of the bonding pad, rigidity against displacement in the first direction can be made higher than that in the second direction. This can suppress damage to the capacitor due to ultrasonic vibration during wire bonding, and thus improving reliability of the capacitor.

Another aspect of the present invention provides a capacitor 600 including: a substrate 110 having a first main surface 110A and a second main surface 110B that are opposite to each other, and including a plurality of trench portions 611 on the first main surface 110A; a dielectric film 130 disposed adjacent the first main surface 110A of the substrate 110 in a region including interiors of the plurality of trench portions 611; a conductor film 140 disposed in a region including the interiors of the plurality of trench portions 611 and on the dielectric film 130; and a bonding pad 661 electrically connected to the conductor film 140, in which, in a plan view from a direction normal to the first main surface 110A of the substrate 110, each of the plurality of trench portions 611 has a shape of an aperture elongated in a first direction X.

This aspect provides the same effect as described in the above aspect. That is, this improves reliability of the capacitor.

In a plan view from the direction normal to the first main surface 110A of the substrate 110, the plurality of trench portions 611 may be arranged such that an aperture area density of first regions 601 disposed along the first direction X, in which a bonding wire 162 electrically connected to the bonding pad 761 is extended, is smaller than an aperture area density of second regions 602 disposed along a second direction Y, the first regions 601 and the second regions 602 being located in a peripheral region of the bonding pad 661, the first direction X and the second direction Y intersecting each other. With this configuration, rigidity against displacement in the first direction can be further enhanced.

Another aspect of the present invention provides a capacitor 200 including: a substrate 110 having a first main surface 110A and a second main surface 110B that are opposite to each other, and including a plurality of trench portions 211 on the first main surface 110A; a dielectric film 130 disposed adjacent the first main surface 110A of the substrate 110 in a region including interiors of the plurality of trench portions 211; a conductor film 140 disposed in a region including the interiors of the plurality of trench portions 211 and on the dielectric film 130; and a bonding pad 261 electrically connected to the conductor film 140, in which, in a plan view from a direction normal to the first main surface 110A of the substrate 110, the plurality of trench portions 211 are arranged such that an aperture area density of first regions 201 disposed along a first direction X, in which a bonding wire 162 electrically connected to the bonding pad 261, is extended is smaller than an aperture area density of second regions disposed along a second direction Y, the first regions and the second regions 202 being located in a peripheral region of the bonding pad 261, the first direction X and the second direction Y intersecting each other.

This aspect provides the same effect as described in the above aspect. That is, this improves reliability of the capacitor.

The plurality of trench portions 211 included in each of the first regions 201 may be less than the plurality of trench portions included in each of the second regions 202. With this configuration, the aperture area density of the first regions can be made smaller than that of the second regions.

Each of the plurality of trench portions 311 in the first regions 301 may be smaller in size than each of the plurality of trench portions 311 in the second regions 302. With this configuration, the aperture area density of the first regions can be made smaller than that of the second regions.

In a plan view from the direction normal to the first main surface 110A of the substrate 110, the plurality of trench portions 411 in each of the first regions 401 may be arranged such that an aperture area density of the plurality of trench portions 411 decreases as a distance from the bonding pad 461 decreases. With this configuration, a capacitance value formed in the first regions can be increased, while suppressing decrease in rigidity of the first regions.

In a plan view from the direction normal to the first main surface 110A of the substrate 110, the plurality of trench portions 711 may be provided in a region 703 overlapping the bonding pad 761. With this configuration, a capacitance value of the capacitor can be increased.

The bonding pad 161 may have a thermal expansion coefficient larger in the first direction X than in the second direction Y intersecting the first direction X. This configuration can suppress damage to the capacitor even when anisotropic internal stress due to the anisotropy of the thermal expansion coefficient of the bonding pad acts on the capacitor.

Each of the above embodiments is described by taking a wire bonding technique as an example of mounting configurations to a capacitor. However, the capacitor according to the embodiments of the present invention may employ other mounting configurations. For example, flip-chip bonding using an Au bump is effective for suppressing damage to the capacitor as in wire bonding. In particular, when the capacitor is ultrasonically vibrated in the first direction to melt and join the Au bump to an external terminal, the same effect as the above described configuration can be obtained. That is, when the direction of the ultrasonic vibration in flip-chip bonding is the same as the extending direction of the bonding wire in the above described embodiments, reliability of the capacitor can be increased.

As described above, one aspect of the present invention provides a capacitor capable of improving reliability.

The above described embodiments are intended to facilitate understanding of the present invention, and are not to be interpreted as limiting the present invention. The present invention can be modified or improved without departing from the purpose, and equivalents are also included in this invention. In other words, those obtained by appropriate design changes to the embodiments made by those skilled in the art are also included in the scope of the invention as long as they include the features of the present invention. For example, each element included in each embodiment, and its arrangement, materials, conditions, shapes, sizes, and the like are not limited to those illustrated, and can be changed as appropriate. In addition, each element included in each embodiment may be combined as long as it is technically possible, and combinations thereof are included in the scope of the present invention as long as they include the features of the present invention.

DESCRIPTION OF REFERENCE SYMBOLS

100: capacitor
101: first region
102: second region
103: third region
110: substrate
110A: first main surface
110B: second main surface
111: trench portion
120: first conductor film
130: dielectric film
131: first dielectric layer
132: second dielectric layer
140: second conductor film
141: first conductor layer
142: second conductor layer
150: insulator film
161: bonding pad
162: bonding wire

The invention claimed is:

1. A capacitor comprising:
a substrate having a first main surface and a second main surface that are opposite to each other, and a plurality of trench portions on the first main surface;
a dielectric film adjacent the first main surface of the substrate and extending into interiors of the plurality of trench portions;
a conductor film on the dielectric film and extending into the interiors of the plurality of trench portions;
a bonding pad electrically connected to the conductor film; and
a bonding wire electrically connected to the bonding pad,
wherein, in a plan view from a direction normal to the first main surface of the substrate, the plurality of trench portions are arranged in second regions disposed along a second direction and not in first regions disposed along a first direction in which the bonding wire extends, the first regions and the second regions being located in a peripheral region of the bonding pad, and the first direction and the second direction intersecting each other.

2. The capacitor according to claim 1, wherein the bonding pad has a thermal expansion coefficient that is larger in the first direction than in the second direction.

3. The capacitor according to claim 1, wherein the dielectric film includes:
a first dielectric layer adjacent the first main surface of the substrate and bottom surfaces and inner surfaces of the trench portions; and
a second dielectric layer on the first dielectric layer,
wherein one of the first dielectric layer and the second dielectric layer is made of a material having a compressive stress and the other is made of a material having a tensile stress.

4. A capacitor comprising:
a substrate having a first main surface and a second main surface that are opposite to each other, and a plurality of trench portions on the first main surface;
a dielectric film adjacent the first main surface of the substrate and extending into interiors of the plurality of trench portions;
a conductor film on the dielectric film and extending into the interiors of the plurality of trench portions; and
a bonding pad electrically connected to the conductor film,
wherein, in a plan view from a direction normal to the first main surface of the substrate, each of the plurality of trench portions has a shape of an aperture elongated in a first direction.

5. The capacitor according to claim 4, further comprising a bonding wire electrically connected to the bonding pad.

6. The capacitor according to claim 5, wherein, in the plan view from the direction normal to the first main surface of the substrate, the plurality of trench portions are arranged in first regions disposed along a first direction in which the bonding wire extends and second regions disposed along a second direction such that a first aperture area density of the first regions is smaller than a second aperture area density of the second regions, the first regions and the second regions being located in a peripheral region of the bonding pad, and the first direction and the second direction intersecting each other.

7. The capacitor according to claim 6, wherein a number of the trench portions in each of the first regions is less than a number of the trench portions in each of the second regions.

8. The capacitor according to claim 6, wherein a size of each of the trench portions in the first regions is smaller than a size of each of the trench portions in the second regions.

9. The capacitor according to claim 6, wherein, in the plan view, the trench portions in each of the first regions are arranged such that an aperture area density thereof decreases as a distance from the bonding pad decreases.

10. The capacitor according to claim 6, wherein, in the plan view, the plurality of trench portions are located in a region overlapping the bonding pad.

11. The capacitor according to claim 4, wherein the bonding pad has a thermal expansion coefficient that is larger in the first direction than in a second direction, the first direction and the second direction intersecting each other.

12. The capacitor according to claim 4, wherein the dielectric film includes:
a first dielectric layer adjacent the first main surface of the substrate and bottom surfaces and inner surfaces of the trench portions; and
a second dielectric layer on the first dielectric layer,
wherein one of the first dielectric layer and the second dielectric layer is made of a material having a compressive stress and the other is made of a material having a tensile stress.

13. A capacitor comprising:
a substrate having a first main surface and a second main surface that are opposite to each other, and a plurality of trench portions on the first main surface;
a dielectric film adjacent the first main surface of the substrate and extending into interiors of the plurality of trench portions;
a conductor film on the dielectric film and extending into the interiors of the plurality of trench portions; and
a bonding pad electrically connected to the conductor film; and
a bonding wire electrically connected to the bonding pad,
wherein, in a plan view from a direction normal to the first main surface of the substrate, the plurality of trench portions are arranged in first regions disposed along a first direction in which the bonding wire extends and second regions disposed along a second direction such that a first aperture area density of the first regions is smaller than a second aperture area density of the second regions, the first regions and the second regions being located in a peripheral region of the bonding pad, and the first direction and the second direction intersecting each other.

14. The capacitor according to claim 13, wherein a number of trench portions in each of the first regions is less than a number of trench portions in each of the second regions.

15. The capacitor according to claim 13, wherein a size of each of the trench portions in the first regions is smaller than a size of each of the trench portions in the second regions.

16. The capacitor according to claim 13, wherein, in the plan view, the trench portions in each of the first regions are arranged such that an aperture area density thereof decreases as a distance from the bonding pad decreases.

17. The capacitor according to claim 13, wherein, in the plan view, the plurality of trench portions are located in a region overlapping the bonding pad.

18. The capacitor according to claim 13, wherein the bonding pad has a thermal expansion coefficient that is larger in the first direction than in the second direction.

19. The capacitor according to claim 13, wherein the dielectric film includes:
- a first dielectric layer adjacent the first main surface of the substrate and bottom surfaces and inner surfaces of the trench portions; and
- a second dielectric layer on the first dielectric layer,
- wherein one of the first dielectric layer and the second dielectric layer is made of a material having a compressive stress and the other is made of a material having a tensile stress.

\* \* \* \* \*